US008963287B1

United States Patent
Tian et al.

(12) United States Patent
(10) Patent No.: US 8,963,287 B1
(45) Date of Patent: *Feb. 24, 2015

(54) DEEP TRENCH CAPACITOR WITH CONFORMALLY-DEPOSITED CONDUCTIVE LAYERS HAVING COMPRESSIVE STRESS

(71) Applicant: Maxim Integrated Products, Inc., San Jose, CA (US)

(72) Inventors: Lei Tian, San Jose, CA (US); Scott W. Barry, Los Gatos, CA (US); Xuejun Ying, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/925,934

(22) Filed: Jun. 25, 2013

Related U.S. Application Data (63) Continuation of application No. 13/029,317, filed on Feb. 17, 2011, now Pat. No. 8,487,405.

(51) Int. Cl.
*H01L 21/02* (2006.01)
*H01L 49/02* (2006.01)

(52) U.S. Cl.
CPC .................................. *H01L 28/40* (2013.01)
USPC .................... 257/532; 257/E29.343; 438/243

(58) Field of Classification Search
USPC .......... 257/532, E29.343; 438/243, 244, 253, 438/386, 396
See application file for complete search history.

(56) References Cited

U.S. PATENT DOCUMENTS

| 7,732,274 | B2 | 6/2010 | Zhu et al. |
| 2006/0051938 | A1* | 3/2006 | Connell et al. ................ 438/460 |
| 2006/0214230 | A1* | 9/2006 | Shimokawa .................. 257/347 |
| 2006/0240576 | A1* | 10/2006 | Gros-Jean et al. ............... 438/3 |

* cited by examiner

*Primary Examiner* — Tucker Wright
(74) *Attorney, Agent, or Firm* — Advent, LLP (57) ABSTRACT

A high density deep trench MIM capacitor structure is provided wherein conductive-compressive-conformally applied layers of a semiconductor material, such as a Poly-$Si_xGe_{1-x}$, are interleaved within MIM capacitor layers to counterbalance the tensile stresses created by such MIM capacitor layers. The interleaving of conductive-compressive-conformally applied material layers are adapted to counterbalance convex (upward) bowing of silicon wafers during the manufacturing process of high density deep trench MIM capacitor silicon devices to thereby help maximize production yields of such devices per wafer.

16 Claims, 3 Drawing Sheets

FIG. 1

Prior Art

DEEP TRENCH CAPACITOR WITH CONFORMALLY-DEPOSITED CONDUCTIVE LAYERS HAVING COMPRESSIVE STRESS

TECHNICAL FIELD

The invention relates to semiconductor devices and, more particularly to closely-packed arrays of deep trench (DT) capacitors for high density single, double or triple MIM silicon based capacitor devices.

BACKGROUND

With emergence of integration technologies, such as Through-Silicon-Via (TSV), to combine passive components with the active component circuits, high density trench (or "hole") capacitors have begun to replace discrete storage capacitors in order to meet the scaling demands of smaller hand-held circuit designs.

A basic trench capacitor is a small three-dimensional device formed by etching a trench into a semiconductor substrate. After trench etching, a doped region may be formed in the lower portion around and below the trench, which serves as an outer electrode or a buried plate electrode of a trench capacitor. A dielectric layer may be formed over the outer or buried plate electrode in the trench. The dielectric layer serves as an insulating layer between the electrodes of the trench capacitor. This is followed by filling the trench, for example, with conductive polycrystalline silicon (herein after poly-Si), which serves as an inner or upper electrode of the trench capacitor. It has become more common to create silicon devices having closely-packed arrays of deep trench capacitors. The deep trenches may have extremely high aspect-ratios (ranging from about 20:1 to about 120:1). The extremely high trench aspect ratios are used to help increase the capacitance density of, for example, double MIM capacitors. The creation of closely-packed arrays of deep trenches increases the top side silicon wafer surface area to be equivalent to that of the area of up to about 50 top side surface-wafers. Furthermore, a double MIM capacitor requires a minimum of six layers. Three layers for the first MIM capacitor (e.g., TiN/Hi-k/TiN) and three additional substantially similar layers for the second MIM capacitor. All of the layers of a MIM capacitor induce tensile stress on the top side or upper surface of the silicon wafer, which with high trench densities causes a silicon wafer to warp or bow upwards.

Figure 1:
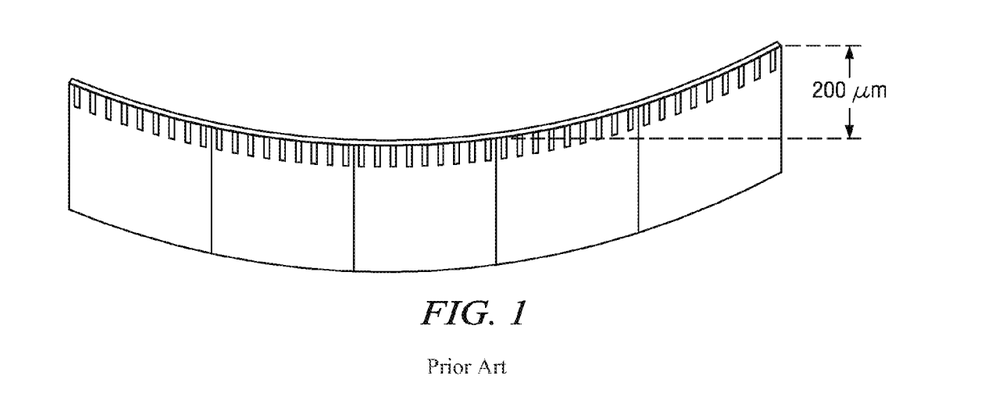
FIG. 1 is a cross-sectional view of a wafer comprising closely-packed arrays of deep trench capacitors on the top side of a wafer.

FIG. 1 is meant to depict a cross sectional view of a silicon wafer comprising closely packed arrays of deep trenches, each having high aspect-ratios, on the wafer's top surface. The combination of the double MIM capacitor layers and the increased surface area on the top side of the wafer causes a wafer to bow upward in a convex manner. Wafer bowing can be up to about two hundred (200) micrometers (um). Wafer bowing impacts the downstream wafer manufacturing process by affecting photo-alignment processes and subjecting the wafers to a higher than normal breakage rate in various stages of wafer fabrication processing and assembly. Furthermore, it has been found that high convex wafer bowing may be increased (for example by an additional 150 micrometers of bow), if an in-situ doped (ISD) poly-Si film or layer is used in a manufacturing process to fill the trenches and interconnect the double MIM capacitors created in the deep trenches. It is well known that ISD poly-Si film may be formed by depositing an amorphous silicon (a-Si) t incorporate enough dopants and annealing the a-Si into poly-Si to activate the dopant. And, it is the anneal that adds additional tensile stress to the top side of a silicon wafer when applied thereon.

The high convex wafer bowing or wafer warpage causes problems during the various manufacturing and assembly steps of a wafer. For example, during a wafer chemical mechanical polishing (CMP) or a grinding process, a warped wafer is more apt toward breakage. Also, when a wafer is warped or not flat, depth measurements for alignments and placements of contact landing pads and their associated contacts are affected. Finally, warpage causes the silicon chip yields to be low, sometimes as low as 10 to 15 percent, due to the above discussed errors and problems encountered during the manufacturing process.

What is needed is a single, double or triple MIM capacitor construction that can be produced in closely-packed, high-density arrays of deep trenches on a top surface of a silicon wafer, which does not cause or counter warpage caused by the tensile stressed layers of material used to produce the single or multi layered deep trench capacitors.

SUMMARY

Embodiments of the invention provide a means and configurations of single, double or triple deep trench MIM capacitor structures formed in closely-packed, high density arrays on the top or front surface of a silicon wafer such that the resulting silicon wafer does not bow or warp to a degree that substantially affects the quality, yield or breakage of the wafers or ultimately the manufactured silicon devices. Embodiments of the invention interleave a conductive, compressive and conformally applied semiconductor layer below, between and/or on top of MIM capacitor structure layers formed in and about deep trenches in the silicon wafer substrate surface. The interleaved conductive, compressive and conformally applied semiconductor layer counterbalances tensile stresses caused by the MIM capacitor structure layers. Furthermore, the interleaved conductive, compressive and conformally applied semiconductor layer(s) also operates as an operational, conductive part of the resulting deep trench MIM capacitor structure and device. Poly-SiGe may be used in various embodiments of the invention as the interleaved conductive, compressive material that can be conformally applied to the surface and into (and along the sides) of the deep trench structures.

Embodiments of the invention include a silicon chip that comprises a plurality of trenched MIM capacitors. Each of the trenched MIM capacitors may comprise a silicon substrate layer having a bottom side and a top side, a portion of the top side defining a plurality of trenches. The trenched MIM capacitor further comprise a first MIM capacitor stack covering the portion of the top side that defines the plurality of trenches and a first conductive compressive material substantially covering the first MIM stack. In some embodiments, the first conductive compressive material may also fill the plurality of trenches to form a single MIM capacitor. In other embodiments, the trenched MIM capacitor further comprises a second MIM capacitor stack covering at least a portion of the first conductive compressive material layer and a second conductive compressive material layer substantially covering the second MIM capacitor stack. Additional embodiments further comprise a compressive passivation oxide layer that substantially covers the upper surface of the trenched MIM capacitor and/or neighboring arrays of trenched MIM capacitors. Additional embodiments of the invention have a third conductive compressive material layer between the top side of the silicon substrate layer and the first MIM capacitor stack layer. The conductive compressive layer may be comprised of Poly-$Si_xGe_{1-x}$ wherein $0.20 \leq x \leq 0.85$.

Other embodiments of the invention include a silicon wafer comprising uncut silicon chip portions. The silicon wafer and/or uncut silicon chip portions comprise an array of deep trenches; the array of deep trenches is used to define a deep trench MIM capacitor. The deep trench MIM capacitor comprises a silicon substrate having a top surface that defines a trench therein, a first MIM stack layer overlaid on the top surface and a first conductive compressive material layer overlaid on the first MIM stack layer. Additional embodiments further comprise a second MIM stack layer overlaid on the first conductive compressive material layer and a second conductive compressive material layer overlaid on the second MIM stack layer. The second conductive compressive material layer may substantially fill the trench structures in some embodiments. The first MIM stack layer comprises a first TiN layer and a second TiN layer with a Hi-k dielectric layer therein between.

BRIEF DESCRIPTION OF THE DRAWINGS

The structure, operation and advantages of embodiments of the present invention will become further apparent upon consideration of the following description, taken in conjunction with the accompanying figures (Figs.). The figures are intended to be illustrative and not limiting. Certain elements in some of the figures may be omitted, or illustrated not-to-scale, for illustrative clarity. The cross-sectional views may be in the form of "slices", or "near-sighted" cross-sectional views, omitting the certain background lines, which would otherwise be visible in a "true" cross-sectional view for illustrative clarity. If shading or cross-hatching is used, it is intended to be of use in distinguishing one element from another (such as a cross-hatched element from a neighboring unshaded element). It should be understood that the figures are not intended to limit the disclosure due to shading or cross-hatching of the drawing figures.

In some of the figures, particularly cross-sectional views of semiconductor devices in various stages of fabrication, some elements may be drawn with very straight edges intersecting with other edges at precise "such as 90-degree" angles, for illustrative clarity. Ones of ordinary skill in the art will appreciate that the edges may not be so straight, the intersections may be rounded, due to the nature of the process such as etching or material deposition on a surface used to form the various elements of the semiconductor devices.

DETAILED DESCRIPTION

In the description that follows, numerous details are set forth in order to provide an understanding of the various embodiments of the present invention. It will be appreciated by those skilled in the art, that the variations of these specific details are possible while still achieving the results of the invention embodiments. Well known process steps and materials are generally not described in detail in order to avoid unnecessarily obfuscating the description of the invention embodiments.

The materials (e.g., silicon dioxide) may be referred to by their formal names, as well as by their chemical formula. Regarding chemical formulas, numbers may be presented in normal font rather than as subscripts. For example, silicon dioxide may be referred to simply as "oxide" or the chemical formula "SiO2". For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as necessarily limiting. They are included to provide a sense of proportion. Generally speaking, it is the relationship between various elements, where they are located, their contrasting compositions, and sometimes their relative sizes that is of significance.

GLOSSARY

Unless otherwise noted or as may be evident from the context of the usage, any terms, abbreviations, acronyms or scientific symbols and notation used herein are to be given their ordinary meaning in a technical discipline to which the invention most nearly pertains. The following terms, abbreviations and acronyms may be used throughout the description presented herein and should generally be given the following meaning unless contradicted or elaborated on by other descriptions set forth herein. Some of the terms set forth may be registered trademarks.

ALD, short for atomic layer deposition. ALD is a gas phase chemical process used to create extremely thin coatings or layers. The majority of ALD reactions use two chemicals, typically called "precursors". These precursors react with a surface one-at-a-time in a sequential manner. By exposing the precursors to the growth surface repeatedly, a thin film is deposited. ALD is a self-limiting, sequential surface chemistry that deposits conformal thin-films of materials on to substrates of varying compositions. ALD can be used to control film growth to as fine as about 0.1 angstroms (Å) per monolayer. ALD can be used to grow or create films that are conformal, pin-hole free and chemically bonded to the substrate. With ALD it is possible to deposit coatings that are nearly perfectly uniform in thickness inside deep trenches, porous media and around particles. The film thickness range is usually from about 1-500 nanometers (nm). ALD can be used to deposit several types of thin films, including ceramics from conductors to insulators.

Capacitor: A capacitor is generally a two-terminal device (electrical or electronic component) that can store energy in the electric field between a pair of conductive electrodes ("plates"). The process of storing energy in a capacitor is known as charging, it involves electric charges of equal magnitude, but opposite polarity, building up on each plate.

CVD, short for chemical vapor deposition. CVD is a chemical process used to produce high-purity, high-performance solid materials. The process is often used in the semiconductor industry to produce thin films. In a typical CVD process, the wafer "substrate" is exposed to one or more volatile precursors, which react and/or decompose on a substrate surface to produce the desired deposit. CVD is used to deposit materials in various forms, including: monocrystalline, polycrystalline, amorphous, and epitaxial. These materials include silicon, oxide, nitride, and metals, which are commonly used in the semiconductor fabrication.

Deposition: Deposition generally refers to the process of applying new material over another material (or the substrate). Chemical vapor deposition (CVD) is a common technique for depositing materials. Other deposition techniques, such as for applying resist or glass, may include spin-on, which generally involves providing a stream of material to the substrate, while a substrate is spinning, resulting in a relatively thin, flat, evenly-distributed coating of the material of the underlined substrate.

Dielectric: A dielectric is a non-conducting material or substance. A dielectric is an electrical insulator. Some dielectrics commonly used in semiconductor technology are SiO2 ("oxide") and Si3N4 ("nitride"). The insulating quality of a dielectric may be characterized by "k", the dielectric constant. Generally, the higher the k, the better the insulating quality of a dielectric. Oxide, for example, has a k of approximately 3.9. The class of materials referred to as "Hi-k" dielectrics have a dielectric constant higher than that of oxide (k>3.9).

Dopant: A dopant is an element introduced into a semiconductor to establish either p-type (acceptors) or n-type (donors) conductivity; common dopants in silicon: for p-type are boron (B), indium (In); for n-type phosphorous (P), arsenic (As), and antimony (Sb).

Doping: Doping is the process of introducing impurities (dopants) into the semiconductor substrate, or elements formed on a semiconductor substrate, and is often performed with a mask (or previously formed elements in place) so that only certain areas of the substrate will be doped.

N-type: An N-type semiconductor is a semiconductor in which the concentration of electrons is higher than the concentration of "holes".

Oxide: Oxide is commonly used to refer to silicon dioxide (SiO2). Also known as silicon. SiO2 is the most common insulator in semiconductor device technology. High quality films are obtained by thermal oxidation of silicon. Thermal SiO2 forms a smooth, low-defect interface with Si, and can also be deposited by CVD. Oxide may also be used to fill trenches, form spacer structures, and as an inter-level dielectric.

Poly: Poly is short for polycrystalline silicon (Si).

P-type: A p-type semiconductor is one in which the concentration of "holes" is higher than the concentration of electrons.

Substrate: A substrate is typically a wafer of semiconductor material such as silicon, germanium, silicon germanium, silicon carbide, and those consisting essentially of III-V compound semiconductors. The term "substrate" as used herein is intended to include a semiconductor substrate, a semiconductor epitaxial layer deposited or otherwise formed on a semiconductor substrate and/or any other type of semiconductor body, and all such semiconductors are contemplated as full within the scope of the present invention. For example, the semiconductor substrate may comprise a semiconductor wafer or one or more die on a wafer, and any epitaxial layers or other type of semiconductor layers formed thereover or associated therewith. A portion or entire semiconductor substrate may be an amorphous, polycrystalline, or single-crystalline. The semiconductor substrate may be doped, undoped or contain doped regions and undoped regions thereof.

Work function: Work function is a measure of conductivity. A work function of a material is the minimum energy (usually measured in electron volts) needed to remove an electron from a solid to a point immediately outside the solid surface (where energy is needed to move an electron from the Fermi energy level into vacuum). Here "immediately" means that the final electron position is far from the surface on atomic scale but still close to the solid on the macroscopic scale. The work function is an important property of metals. The magnitude of work function is usually about a half of the ionization energy of a free atom in the middle.

It will be understood that when an element such as a layer, region or substrate is referred to being "on" another element, it can be directly on the other element or intervening elements may also be present. In contrast, when an element is referred to as being "directly on" another element, there are no intervening elements present. It will also be understood that when the element is referred to as being "connected" or "coupled" to another element, it can be directly connected or coupled to the other elements or intervening elements may be present. In contrast, when an element is referred to as being "directly connected" or "directly coupled" to another element, there are no intervening elements present.

Embodiments of the invention comprise arrays of deep trench (DT) MIM capacitors formed on the top surface of the silicon wafer. As deep trench capacitor densities reach higher and higher capacitor densities across a wafer surface, the surface area of the front or top side of the wafer becomes very large when compared to the surface area of the back side or bottom of the wafer. It is found that an uneven balance of top side to bottom side surface wafer area causes silicon wafers to bow up or warp in a convex manner. The warpage causes manufacturing problems and wafer breakage issues during the manufacturing process. The warpage issue causes yield percentages of DT MIM capacitor devices to be very low for each wafer.

It was further discovered that in high density DT MIM capacitor devices the metal-insulator-metal (MIM) layers of the MIM capacitors deposited on the top side of the silicon wafer are all materials that cause tensile stress, which further exacerbates the wafer bowing or warpage caused by the dense population of deep trenches.

After various experimentations, it was determined through experimentation the wafer bowing problem could be resolved by incorporating a conductive layer or material that exhibits compressive stress attributes into the layered structure of a deep trench MIM capacitor. The compressive stress attributes of the new conductive layer was found to be able to counterbalance the tensile stress forces of the MIM capacitor layers. Since the deep trenches may have aspect ratios ranging from about 20:1 to as large as 120 to 1, it was important that the material used must be not only conductive and have compressive attributes, but also must be able to be conformally deposited or applied to the wafer so that it can form substantially uniform layers down the sides and along the bottom of the deep trenches as well as be able to fill the deep trenches when necessary, without leaving spaces, openings or unfilled areas that may weaken the high density deep trench capacitor structure or incorporate defects.

Figure 2:
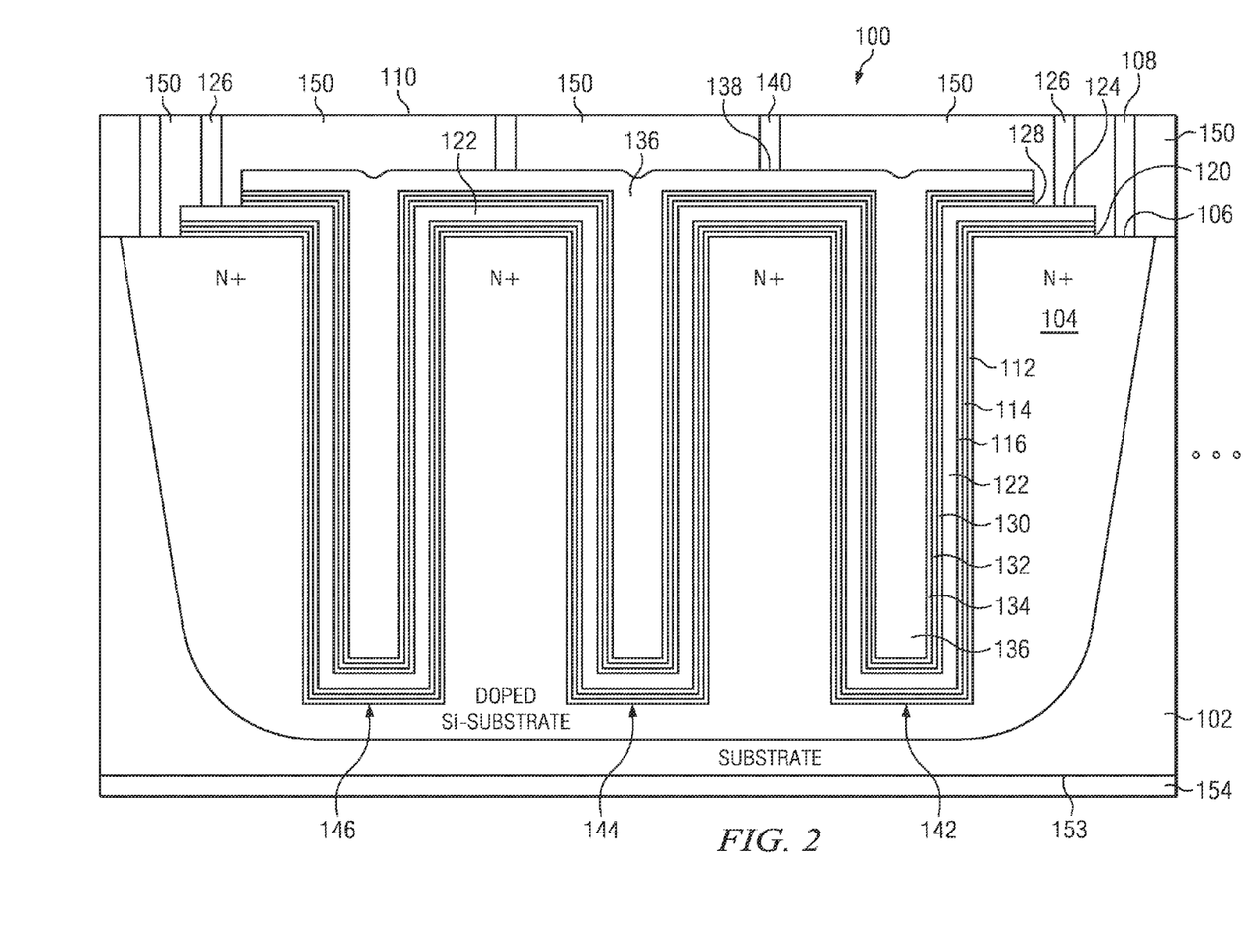
FIG. 2 is a cross-sectional view of a portion of a wafer or silicon chip having a deep trench double MIM capacitor according to an illustrative embodiment of the invention.

Referring now to FIG. 2, an exemplary deep trench MIM capacitor is shown. This exemplary MIM capacitor 100 is an exemplary double MIM capacitor structure formed on a wafer. The double DT MIM capacitor 100 is a portion of, for example, a silicon wafer or silicon chip or die cut from an exemplary silicon wafer. An exemplary double DT MIM capacitor is manufactured or incorporated onto a silicon substrate 102. If the silicon substrate 102 is not already doped as N+, a doped well 104 may be doped to be N+. In some embodiments, the N+ area or well 104 could be doped to be P+. The N+ well 104 may act as a landing pad 106 for the bottom of connection 108. The connection 108 is the electrical interface between the bottom electrode of the bottom MIM capacitor 120 and the metal interconnecting lines (not specifically shown) on the top surface 110 of the silicon device.

The N+ or doped silicon substrate 104 also acts as an interconnect between the bottom electrode 112 of the first MIM capacitor and the bottom connection 108. The bottom electrode 112 of the first MIM capacitor is a layer of titanium nitride (TiN). The bottom titanium nitride layer 112 is typically about 100 angstroms thick, but may have a thickness range of from about 50 angstroms to about 200 angstroms. The bottom layer 112 of the first MIM 120 is a metal or conductive layer that can be substantially any conductive metal layer with an appropriate work function. Instead of TiN, the bottom electrode 112 of the first MIM can be comprised of, for example, tantalum nitride (TaN), ruthenium (Ru) or other titanium or tantalum based compounds having an appropriate conductive work function. Presently, TiN is the least expensive compound of the available conductive metals and is therefore used heavily in such structures, however other substantially equivalent conductive metal layers may also be used.

Deposited directly on top of the bottom electrode 112 of the first MIM 120 is the center insulating layer 114 of the first MIM. The center insulating layer 114 may also be referred to as a Hi-k dielectric or Hi-k insulating layer 114. The typical thickness of the Hi-k dielectric layer 114 is about 250 angstroms, but could range from about 50 angstroms to about 500 angstroms depending on the Hi-k material being used in this layer 114. The Hi-k layer 114 may be made of various dielectric materials that provide appropriate properties that minimize leakage currents and provide for a high breakdown voltage. The higher the k or the higher the k-material, the better. Exemplary embodiments may use a hafnium aluminate oxide (HfAlO). Other embodiments may use zirconium oxide ($ZrO_2$), aluminum oxide, titanium oxide or other Hi-k dielectric insulative materials.

The next layer on top of the dielectric layer 114 is another metallic layer, which is the top layer or electrode 116 of the first MIM capacitor 120. The top layer or electrode 116 of the first MIM capacitor 120 is substantially the same as the bottom layer or electrode 112 of the first MIM capacitor. Thus, the top layer 116 is most likely made out of the same conductive material, such as TiN, and has a similar thickness as the bottom electrode 112. The bottom electrode 112, center insulating layer 114 and top electrode 116 establish the first MIM capacitor 112 and may be referred to herein as the first MIM capacitor stack 120. Furthermore, all of the layers of the first MIM stacked may have been deposited by ALD techniques. ALD has been found to be the most effective method of getting near uniform layer deposition inside and on the walls of deep trenches that have high aspect ratios.

Each of the layers of the first MIM capacitor stack 120 creates and adds to the tensile strain of the top surfaces of the overall silicon wafer. It was found that the inclusion of a conductive, conformally deposited, compressive strain creating layer can counter the tensile stress of the MIM capacitor stack layers. Furthermore, it was found that there are very few conductive materials that can be conformally deposited as a layer in deep trenches and produce a compressive strain in a semiconductor. It was found that poly silicon germanium (Poly-SiGe) is one of the only materials that can be economically utilized at this time, which provides conductivity, conformal deposition and compressive strain. There may be other such materials, but at this time such materials are not economically or commonly used in the semiconductor manufacturing industry. As such, in embodiments, a Poly-SiGe layer 122 is deposited conformally on the first MIM capacitor stack 120 as the mid Poly-SiGe layer. The Poly-SiGe layer 122 may be conformally deposited directly on the top layer of the first MIM capacitor 120. The mid Poly-SiGe layer 122 should be as thick as feasibly possible in order to help counteract the tensile stress from the plurality of MIM stack layers. The mid-Poly-SiGe layer 122 cannot be too thick or it will hinder the deposition of other layers, such as those in a second or third MIM stack, from being deposited on the side and bottom inner surfaces of the trench. A typical thickness for the mid Poly-SiGe layer 122 is about 500 angstroms. Various embodiments may have mid Poly-SiGe layers having a thickness between about 200 angstroms to about 1000 angstroms.

The mid Poly-SiGe layer 122 or a portion thereof may also be adapted to act as a contact landing pad 124 for a mid connection 126 within the double MIM capacitor structure. Furthermore, the mid Poly-SiGe layer 122 acts as an electrical interconnect for the mid electrode of the double MIM structure (i.e., the top electrode of the first MIM capacitor 120 and the bottom electrode of the second MIM capacitor 128). The mid Poly-SiGe layer 122 may also be N-doped or P-doped as necessary.

Since the mid Poly-SiGe layer 122 conforms to and follows the tensile stressed layers of the MIM capacitor stacks 120, 128, into and out of the plurality of trenches, the compressive stress characteristics of the Poly-SiGe layer 122 effectively helps to counter the tensile stress attributes of the MIM capacitor stacks 120, 128.

In the semiconductor industry, at this time, there is no other material like Poly-SiGe, which is (all three) conductive, compressive and that can be conformally applied into high aspect ratio trenches such as those found in single, double and triple stacked DT MIM capacitor configurations. Furthermore, the mid Poly-SiGe layer 122 not only helps to counter the tensile stress, but in doing so is also a functional part of the resulting DT MIM capacitor structure.

An exemplary Poly-SiGe layer may be applied conformally in high aspect ratio trenches via a low pressure chemical vapor deposition (CVD) process at a temperature of about 400° C. to about 600° C. under a pressure of about 70 mTorr to about 500 mTorr, with $SiH_4$ and $GeH_4$ being the precursor gases and $BCl_3$ as the p-type doping source. Thus, Poly-SiGe is one material that meets the three requirements for being utilized in embodiments of the present invention. The three requirements, being that the material used must be conductive, provide compressive stress and can be deposited conformally as a film layer in high aspect ratio deep trenches.

A second MIM capacitor stack 128 is deposited on top of the mid Poly-SiGe layer 122. The second MIM capacitor stack 128 has a bottom electrode 130, which is a conductive material that is the same or substantially similar to the bottom electrode 112 and top electrode 116 of the first MIM capacitor stack 120. The bottom and top electrodes 130 and 134 of the second MIM stack 128, in some embodiments, may be made of TiN and each have a thickness of from about 50 to about 200 angstroms. The center insulation layer 132 of the second MIM stack 128 may also be similar or substantially the same as the center insulating layer 114 of the first MIM stack 120. The center insulation layer 132 of the second MIM stack, in some embodiments, is made of a Hi-k dielectric or insulator having a thickness that is typically about 250 angstroms. Embodiments may have a center insulating layer of 132 with a thickness ranging from about 50 angstroms to about 500 angstroms. Again, all the MIM layers may have been deposited by an atomic layer deposition (ALD) process, which is an effective method of getting a near uniform deposition layer inside and on the walls of deep trenches having large aspect ratios (ranging from about 20:1 to as large as 120:1).

On top of, or directly on top of, the second MIM capacitor stack 128 and the top electrode layer 134 of the second MIM capacitor stack is a second Poly-SiGe layer 136 that is conductive. The second Poly-SiGe layer 136 may be doped to the N-type or P-type. In FIG. 2, the second Poly-SiGe layer 136 conformally covers the TiN top electrode 134 of the second MIM stack while it also fills the unfilled trench area above the previous deposition layers. The purpose of this second Poly-SiGe layer 136 is to act as a top contact landing pad for a top contact landing pad 138 for the top connection 140. The other purpose for the second Poly-SiGe layer 136 is to act as an electrical interconnection between the top connection 140 and the top electrode 134 of the second MIM stack 128. Furthermore, another important function of the second Poly-SiGe layer 136 is that it fills the trenches to give structural integrity and provide a counter force (a compressive material attribute) to counter the tensile stress created by the plurality of layers in the first and second MIM stacks 120, 128. The second Poly-SiGe layer 136 also fills up the trenches to minimize the introduction and defects into the finished products. This second layer of Poly-SiGe 136 acts as a trench filling material, yet it is functionally part of the double MIM capacitor structure while countering the bowing effects of the plurality of tensile stressed deep trench MIM capacitor stack layers.

Although FIG. 2 shows three trenches 142, 144 and 146 having the exemplary double MIM capacity stack configuration with a mid Poly-SiGe layer 122 and second Poly-SiGe layer 136, it should be understood that a single silicon chip that incorporates embodiments of the invention may have millions of trenches therein. An individual trench may be from about 0.3 to about 0.7 microns wide, from about 5 to about 20 microns long, and from about 20 to about 40 microns deep. Each N well or doped silicon substrate 104 may have a few hundred to about a million trenches having exemplary single, double or triple DT MIM capacitor structures. Each doped N well or P well 104 is typically one single, double or triple MIM capacitor. Though trenches are used in the exemplary embodiments, other embodiments may use holes or any deeply-etched structures with high aspect ratios that increase the capacitor density.

It was found that, as the density of trenches for MIM capacitor structures increases, the upward or convex warping of silicon wafers also increases. At some point the density is large enough that the wafer warpage causes manufacturing problems such that Poly-SiGe conductive layers may be used to effectively counter the warpage caused by the tensile stress created from the various MIM stack capacitor layers. Exemplary embodiments have a density range of trenches so as to produce capacitors having a capacitance from about 0.20 picofarads per micron squared (pF/um$^2$) to about three (pF/um$^2$). The capacitive density is controlled by the trench depth, the trench density in a doped silicon substrate N+ or P+ area 104, and whether the DT MIM capacitors are single, double or triple MIM capacitors.

A silicon wafer may be divided into a plurality of individual silicon chips each having one, two, five or more separate DT MIM capacitor structures in accordance with embodiments of the invention.

In some embodiments a top compressive dielectric layer 150 may be on or above the second Poly-SiGe layer 136 as well as on or above the other layers of an exemplary MIM capacitor structure that comprises of conformally deposited conductive layers having compressive stress. The bottom connection 108, mid connection 126 and the top connection 140 may extend from their respective landing pads to the top surface 110 of the compressive dielectric layer 150. The compressive dielectric layer 150 further helps to balance the tensile forces of the first and second MIM stack layers 120, 128 such that wafer bowing is minimized.

In some embodiments a back side or bottom side tensile stress layer 154 of material is deposed or applied to the bottom side or back side 153 of the silicon wafer substrate 102. The back side layer 154 may comprise silicon nitride (Si3N4), which has a very high tensile stress. When silicon nitride is applied as a back side layer 154, it can further help counter the convex or upward warping of a silicon wafer that incorporates deep trench MIM capacitor structures. It should be understood that although a back side layer 154 of silicon nitride may help, its help is limited because the back side 153 of the wafer is a flat surface, which comprises much less surface area than the trenched front side of the wafer that is covered with multiple MIM stack layers creating tensile strain.

Thus, it is advantageous to incorporate a material that is conductive, able to be conformally applied or deposited, and creates compressive stress as a interconnect material and trench filling material in exemplary deep trench MIM capacitor structures and devices, because an exemplary material, like Poly-SiGe is layered on, and scales with, the surface area of the silicon wafer top side (surface and trench surfaces). In other words the exemplary Poly-SiGe scales with the surface enhancement caused by the multitudes of trenches with the tensile layers deposed thereon and therein.

It should be noted that the very top compressive dielectric or ILD oxide 150, like the bottom side layer 154 of silicon nitride, does not scale with the increased surface area enhancement of the top side of the wafer caused by the incorporation of the thousands to millions of trenches per silicon chip portion.

Through experimentation it is found that a wafer having a high density of deep trenches etched therein could be made to have a concave bow (downward bow) after deposition of a single Poly-SiGe layer of about 1500 angstroms having varied characterizations. For example, it was found that when a Poly-SiGe deposition layer was 70% Ge, a downward bow of about 8 microns (um) was created. When the percentage of Ge in the Poly-SiGe deposition layer was 60%, a 21 um concave bow was established. Furthermore, when a Poly-SiGe layer comprised 30% Ge, a 49 um concave bow was created. The results of the experimental test shows that Poly-SiGe can be successfully used to add compressive stress that can counter tensile stress produced by other deposition layers on a silicon wafer. Furthermore, an unexpected result occurred in that the concave bow or the amount of stress produced by the Ge increased as the percentage of Ge in the Poly-SiGe material decreased in the given test ranges. As such, it was experimentally determined and extrapolated that embodiments of the invention may use a Poly-Si$_x$Ge$_{1-x}$ composition wherein $0.2 \le x \le 0.85$. In other words, a conformal deposition of a conductive compressive layer, such as a film of in-situ doped Poly-Si$_x$Ge$_{1-x}$ ($0.20 \le x \le 0.85$) by low pressure CVD, as a trench filling material was found to be capable of reducing or countering the convex wafer bowing caused by DT MIM stack tensile layers deposited in high density deep trench structures. The conformal deposition of conductive compressive layers enables tensile stress balancing inside the deep trenches as well as on the top surface, which removes the stress/wafer bowing constraints found in prior deep trench high density products that do not incorporate the conformal deposition of a conducting compressive layer in accordance with embodiments of the invention.

Although not specifically shown in FIG. 2 some embodiments may comprise a Poly-SiGe conductive layer as a first layer on the doped Si substrate 104 prior to deposition of the bottom electrode 112 of the first MIM stack 120. Such an additional initial Poly-SiGe layer will add additional counter balancing compressive stress in embodiments of the invention.

Figure 3:
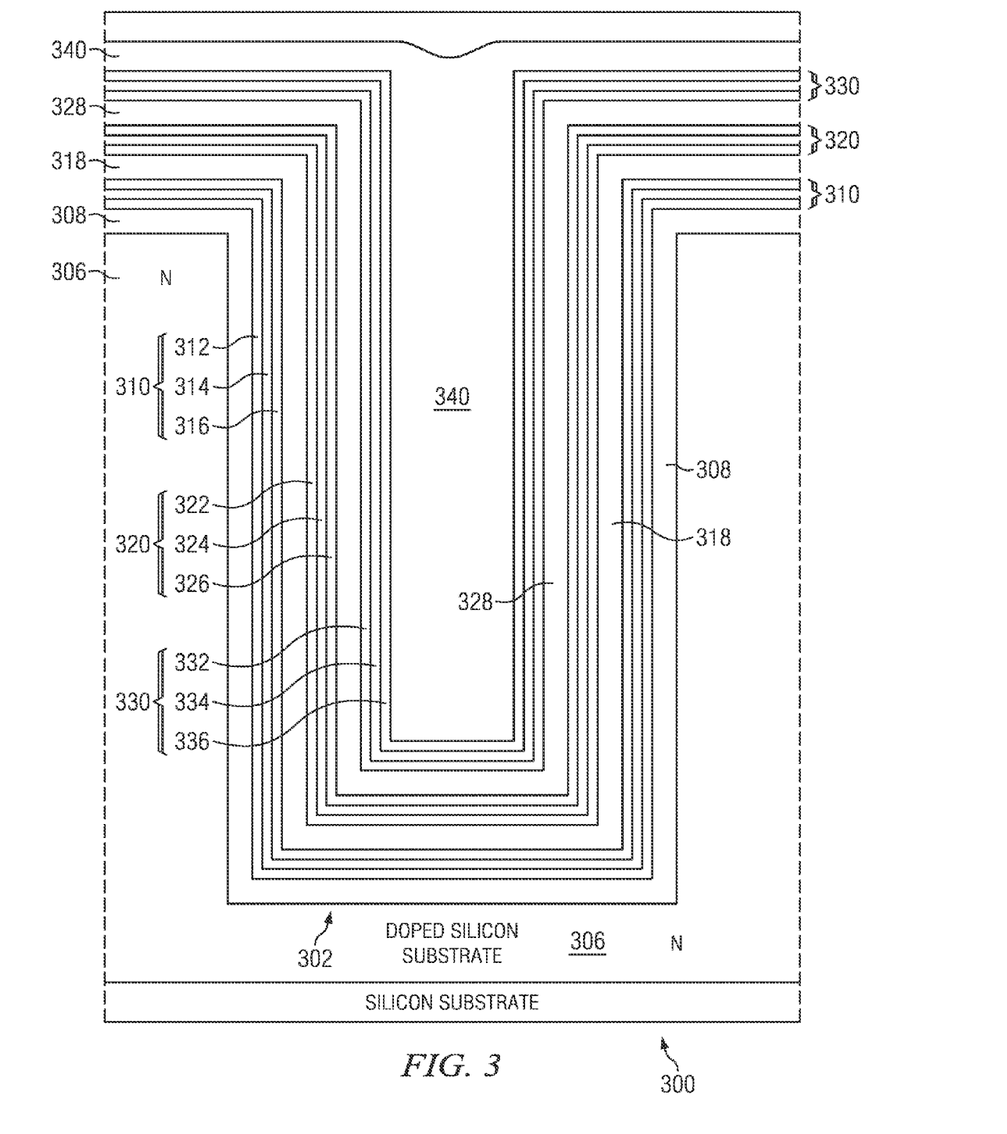
FIG. 3 is a cross-sectional view of a single trench portion of a deep trench triple MIM capacitor according to an illustrative embodiment of the invention.

Referring now to FIG. 3, a small cut-away portion of a deep trench triple MIM capacitor 300 is shown. The exemplary deep trench 302 is formed in a doped silicon substrate 306. The doped silicon substrate 306 may be doped as an N type or P type region. In this exemplary triple MIM capacitor 300 the first conformal depositional conductive compressive layer 308, such as a film of in-situ doped Poly-SiGe is conformally applied onto the top surface and trench wall surfaces of the doped Si-substrate 306. A first MIM stack 310 comprising a lower conductive layer 312 a dielectric layer 314 and an upper conductive layer 316 is on the first Poly-SiGe layer 308. In some embodiments, the conductive layers 312, 316 of the first MIM stack 310 may be titanium nitride (TiN). The central dielectric 314 is a Hi-k dielectric material. On top of the first MIM capacitor stack 310 is a second conformally applied deposition conductor being a compressive material layer 318 such as Poly-SiGe. Next, a second MIM capacitor stack 320 made of a first conductive layer 322 a middle Hi-k dielectric layer 324 and a top conductive layer 326 is on top of the conductive-compressive-conformally applied layer 318. A third conductive-compressive-conformally applied layer 328, such as Poly-SiGe, substantially covers the second MIM stack layer 320. A third MIM stack capacitor layer 330 comprising a lower conductive layer 332 a mid Hi-k dielectric layer 334 and another conductive layer 336 covers or substantially covers the third conductive-compressive-conformally applied Poly-SiGe layer 328. Filling the remaining unfilled portion of the deep trench 302 is a top conductive-compressive-conformally applied layer 340, which may be comprised of Poly-SiGe. This top Poly-SiGe layer 340 not only fills the remaining portion of the deep trench 302, but also substantially covers the exemplary triple MIM capacitor 300.

The first, second, third and top conformal deposition of conductive-compressive-conformally applied layers 308, 318, 328, 340 are each adapted to combinationally or synergistically counter-balance some or all of the tensile forces associated with the first, second, and third MIM stack layers 310, 320, 330 via the compressive stress being exerted by, for example the Poly-SiGe material comprised in the conductive-compressive layers 308, 318, 328, 340. The Poly-SiGe layers 308, 318, 328, 340 may each have the same or different percentages of germanium (Ge) contained therein to effectively counter-balance the tensile forces caused by MIM stack capacitor layers and effectively limit or minimize any resulting wafer convex (upward) bowing caused by the high density arrays of triple DT MIM capacitors formed on the top side of a silicon wafer. Furthermore, the layer thicknesses of the first, second and third conductive-compressive-conformally applied layers 306, 318 and 328 may each be substantially the same in some embodiments, but in other embodiments the thicknesses may vary.

The invention has been shown and described with respect to certain embodiments, certain equivalent alterations and modifications will occur to others skilled in the art upon reading and understanding of this specification and drawings. In addition, while a particular feature of the invention may have been disclosed with respect to only one or some of the exemplary embodiments, such feature may be combined with one or more features of other embodiments as may be desired and thereby become advantageous for any given or particular application, the scope of which is defined by the following claims.

What is claimed is:

1. A silicon chip comprising:
a trenched MIM capacitor comprising:
a silicon substrate layer having a bottom side and a top side, a portion of the top side defining a plurality of trenches;
a first MIM capacitor stack covering the portion of the top side; and
a first conductive compressive material layer substantially covering the first MIM capacitor stack,
wherein the first conductive compressive material layer comprises Poly-Si$_x$Ge$_{1-x}$.

2. The silicon chip of claim 1, wherein the first conductive compressive material layer fills the plurality of trenches.

3. The silicon chip of claim 1, wherein the trenched MIM capacitor further comprises:
a second MIM capacitor stack covering at least a portion of the first conductive compressive material layer, and
a second conductive compressive material layer substantially covering the second MIM capacitor stack.

4. The silicon chip of claim 1, further comprising a compressive passivation oxide layer that substantially covers an upper surface of the plurality of trenched MIM capacitors.

5. The silicon chip of claim 1, further comprising a tensile material layer on the bottom side.

6. The silicon chip of claim 1, wherein the silicon chip is part of a silicon wafer.

7. The silicon chip of claim 1, further comprising a third conductive compressive material layer between the top side and the first MIM capacitor stack.

8. The silicon chip of claim 1, wherein the first MIM capacitor stack comprises a first Hi-k layer between a first TiN layer and a second TiN layer.

9. A silicon wafer comprising a silicon chip portion, the silicon chip portion comprises an array of deep trenches; the array of deep trenches define a deep trench MIM capacitor comprising:
a silicon substrate having a top surface that defines a trench therein;
a first MIM stack layer overlaid on the top surface; and
a first conductive compressive material layer overlaid on the first MIM stack layer,
wherein the first conductive compressive layer comprises Poly-Si$_x$Ge$_{1-x}$, wherein a 0.2<x<0.85.

10. The silicon wafer of claim 9, wherein the deep-trench MIM capacitor further comprises:
a second MIM stack layer overlaid on the first conductive compressive material layer; and
a second conductive compressive material layer overlaid on the second MIM stack layer.

11. The silicon wafer of claim 10, wherein the second conductive compressive material layer substantially fills the trench.

12. The silicon wafer of claim 9, further comprising a third conductive compressive material layer overlaid over the top surface between the top surface and the first MIM stack layer.

13. The silicon wafer of claim 9, where first MIM stack layer comprises a first TiN layer and a second TiN layer with a Hi-k layer therebetween.

14. A silicon chip comprising:
a deeply-etched structure MIM capacitor comprising:
a silicon substrate layer having a bottom side and a top side, a portion of the top side defining a plurality of deeply-etched high aspect ratio structures, wherein the high aspect ratio ranges from about 20:1 to about 120:1;
a first MIM capacitor stack covering the portion of the top side; and a first conductive compressive material layer substantially covering the first MIM capacitor stack, wherein the first conductive compressive material layer comprises Poly-Si$_x$Ge$_{1-x}$.

15. The silicon chip of claim 14, wherein the first conductive compressive material layer fills the plurality of deeply-etched high aspect ratio structures.

16. The silicon chip of claim 14, wherein the deeply etched structure MIM capacitor further comprises:

a second MIM capacitor stack covering at least a portion of the first conductive compressive material layer; and a second conductive compressive material layer substantially covering the second MIM capacitor stack.

* * * * *